(12) United States Patent
Sherry

(10) Patent No.: US 9,464,933 B1
(45) Date of Patent: Oct. 11, 2016

(54) NEAR-FIELD TERAHERTZ IMAGER

(71) Applicant: STMicroelectronics SA, Montrouge (FR)

(72) Inventor: Hani Sherry, Grenoble (FR)

(73) Assignee: STMICROELECTRONICS SA, Montrouge (FR)

( * ) Notice: Subject to any disclaimer, the term of this patent is extended or adjusted under 35 U.S.C. 154(b) by 0 days.

(21) Appl. No.: 14/920,373

(22) Filed: Oct. 22, 2015

(30) Foreign Application Priority Data

Apr. 21, 2015 (FR) ...................................... 15 53569

(51) Int. Cl.
*G01J 1/42* (2006.01)
*G01J 1/44* (2006.01)
(52) U.S. Cl.
CPC ................ *G01J 1/4228* (2013.01); *G01J 1/44* (2013.01)
(58) Field of Classification Search
CPC ................................ G01J 1/4228; G01J 1/44
See application file for complete search history.

(56) References Cited

U.S. PATENT DOCUMENTS

| 2012/0274410 | A1 | 11/2012 | Koyama |
| 2014/0070103 | A1 | 3/2014 | Sherry et al. |
| 2014/0166868 | A1 | 6/2014 | Tekin et al. |

FOREIGN PATENT DOCUMENTS

WO    2010/105373 A1    9/2010

OTHER PUBLICATIONS

Al Hadi et al., "A 1 κ-Pixel Video Camera for 0.7-1.1 Terahertz Imaging Applications in 65-nm CMOS," *IEEE Journal of Solid-State Circuits* 47(12):2999-3012, 2012.
Feuillet-Palma et al., "Strong near-field enhancement in THz nano-antenna arrays," *Scientific Reports* 3(1361):1-8, 2013.
Schnell et al., "Nanofocusing of mid-infrared energy with tapered transmission lines," *Nature Photonics* 5:283-287, 2011.
Tousi et al., "A 283-to-296Ghz VCO with 0.76mW Peak Output Power in 65nm CMOS," 2012 IEEE International Solid-State Circuits Conference, ISSCC 2012, Session 15, mm-WAVE & THz Techniques, 15.4, 2012, pp. 258-260. (3 pages).

*Primary Examiner* — Mark R Gaworecki
(74) *Attorney, Agent, or Firm* — Seed IP Law Group PLLC

(57) ABSTRACT

The present disclosure concerns a high frequency imager including a pixel matrix, each pixel including a high frequency oscillator, a transmission line positioned at a distance from an active surface of the imager smaller than the operating wavelength of the oscillator, a first end of the line being coupled to the oscillator, and a read circuit coupled to a second end of the line.

17 Claims, 4 Drawing Sheets

NEAR-FIELD TERAHERTZ IMAGER

BACKGROUND

1. Technical Field

The present disclosure relates to high frequency imagers, for example terahertz imagers, formed from a pixel matrix.

2. Description of the Related Art

Terahertz imagers are devices adapted to capture the image of a scene based on terahertz waves, i.e., waves having a frequency that is for example comprised between 0.3 and 3 THz. A conventional imager such as disclosed in the U.S. Patent Application Publication No. 2014/070103 of the applicant includes a terahertz waves emitter for illuminating a scene to be imaged, and a sensor made of a pixel matrix that receives terahertz waves from the scene. Terahertz imagers are used in a large number of applications in which it is wished to see through some materials of a scene. Indeed, terahertz waves penetrate a large number of dielectric materials and non-polar liquids, are absorbed by water and are almost entirely reflected by metals. Terahertz imagers are in particular used in security scanners in airports to see through the clothes of a person or through luggage so as to detect metallic objects for example.

FIG. 1 is a reproduction of FIG. 1 of U.S. Patent Application Publication No. 2014/070103. The sensor 1 includes a matrix 3 of pixels 5 adapted to capture terahertz waves. A row decoder 7 receives a row selection signal 9 that indicates which row is to be read and provides to the lines of the matrix 3 a corresponding control signal 11. The pixel matrix 3 provides output signals 13 for each column of the matrix. The output signals 13 are coupled to an output block 15 that selects and controls each column. The reading of the columns is controlled by a column decoder 17 coupled to the output block 15 and, in this example, the columns are read the one after the other. The output block 15 provides an output signal 19 representing the value of the pixel 5 of the selected row and column. The output signal 19 is amplified and coupled to an analog to digital converter 21.

To analyze the received signal, this signal is combined with a reference terahertz signal provided by an oscillator 23. The oscillator 23 is disposed outside of the matrix 3 and provides a same terahertz signal to a large number of pixels or to all the pixels of the sensor 1. This oscillator 23 is preferably coupled with a terahertz emitter, not shown, illuminating the scene to be analyzed.

FIG. 2 is a reproduction of FIG. 3 of US application No 2014/070103 and illustrates an example of one pixel 5 of the sensor 1. The pixel 5 comprises a detecting antenna 25 and a detection circuit 27 formed, in this example, of two N-MOS transistors 29, the gates of which are biased at a potential $V_{gate}$. The antenna is coupled to the oscillator 23 shown in FIG. 1 and to the detection circuit 27. The output of the detection circuit 27 is coupled to a row and column selection circuit 31. The selection circuit 31 is controlled by a signal $R_{SEL}$ provided by the row decoder 7 of the sensor 1 and by a signal $C_{SEL}$ provided by the column decoder 17 of the sensor 1. The analog output signal 19 representing the value of the pixel 5 is available at a node $COL_{OUT}$ that is coupled to the converter 21 (FIG. 1) of the sensor 1.

FIG. 3 is a reproduction of FIG. 5 of US application No 2014/070103 representing an example of a frequency oscillation circuit 33 of a terahertz imager. The circuit 33 comprises a ring oscillator made of an odd number N of inverters, three in this example. Each inverter includes a NMOS transistor 35 the drain of which is coupled to a node 37 and the source of which is coupled to ground. Each node 37 is coupled through an inductor 39 to the gate of the next transistor 35, the inductors 39 having a same inductance value. Each node 37 is further coupled to a summation node 41 through an inductor 43, the inductors 43 all having the same inductance value. The summation node 41 is coupled to a DC voltage source 45 via an inductor 47 and to an output node 49 of emitter 33 via an inductor 51. As shown, the output node 49 can be grounded, for example through a resistor 53.

In operation, the signal generated by the ring oscillator has a fundamental sinusoidal component of frequency F and harmonic sinusoidal components one of which has a frequency N*F. The value of each inductor 43 is selected to implement a band-pass filter centered on the frequency N*F, and an output signal having a frequency $f_{LO}$ equal to N*F is available at the output node 49 of the emitter 33 that is coupled to a terahertz emission antenna.

FIG. 4 is a partial reproduction of FIG. 8 of US application No 2014/070103 and schematically illustrates an example implementation of the frequency oscillation circuit 33 as disclosed in connection with FIG. 3, but with five inverters instead of three. In this example, each inductor 39, 43, 51 is implemented as a transmission line.

The terahertz imager disclosed in connection with FIGS. 1-4 is a far-field imager provided for seeing through some materials of voluminous objects, seen at a far distance from the object, having sizes greater than 10 cm, preferably greater than 1 meter. The resolution of an image obtained with a far-field imager is at best of about the operating wavelength of the imager, i.e., 1 mm at a frequency of 300 GHz and 0.1 nm at a frequency of 3 THz. To improve the spatial resolution of a far-field imager it is possible to increase the operating frequency of the imager. However, this raises various problems. Thus, a far-field terahertz imager is not adapted to obtaining an image having a resolution in the order of tenths of a micrometer.

Near-field terahertz imagers provide an image of an object to be analyzed with a resolution in the order of tenths of a micrometer. However, these imagers are complex to implement, in particular due to the fact that they use terahertz emission sources such as coherent synchrotron radiations, and optical systems such as elliptical mirrors. An example of such a near-field imager is disclosed in the article "THz near-field imaging of biological tissues employing synchrotron radiation" of Shade et al., published in 2005 in Ultrafast Phenomena in Semiconductors and Nanostructure Materials IX, 46.

Thus, it would be desirable to provide a near-field terahertz imager that is as simple as possible and that provides an image having a resolution in the order of tenths of a micrometer.

BRIEF SUMMARY

Thus, an embodiment provides a high frequency imager comprising a pixel matrix, each pixel comprising: a high frequency oscillator; a transmission line positioned at a distance from an active surface of the imager smaller than the operating wavelength of the oscillator, a first end of the line being coupled to the oscillator; and a read circuit coupled to a second end of the line.

According to an embodiment, the read circuit of each pixel provides a signal representative of the impedance of the transmission line.

According to an embodiment, the oscillator of each pixel comprises second transmission lines.

According to an embodiment, a layer adapted to block the propagation of the high frequency waves covers at least the second lines.

According to an embodiment, the read circuit of a pixel provides a signal representative of the frequency of the oscillator of the pixel.

According to an embodiment, the transmission lines are of the microstrip type.

According to an embodiment, the imager is adapted to operate at a frequency selected in a range of 0.3 to 3 THz.

BRIEF DESCRIPTION OF THE DRAWINGS

The foregoing and other features, aspects and advantages of the present disclosure will become apparent from the following detailed description of embodiments, given by way of illustration and not limitation with reference to the accompanying drawings in which.

DETAILED DESCRIPTION

The same elements have been designated by same references in the various figures and additionally the figures are not drawn to scale. In the following description, the terms "over" and "higher" refer to the orientations of the related elements in the corresponding figures. Unless stated otherwise, the expressions "about" and "in the order of" mean within 10%, or preferentially within 5%, of the stated value.

Figure 1:
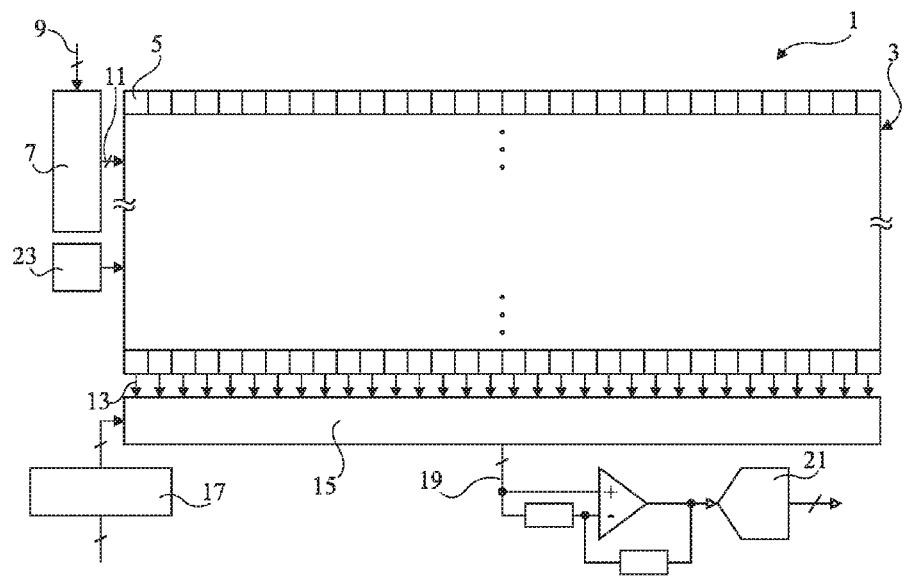
FIG. 1, described above, is a reproduction of FIG. 1 of US patent application No 2014/070103 schematically representing an example of a terahertz imager sensor.
Figure 2:
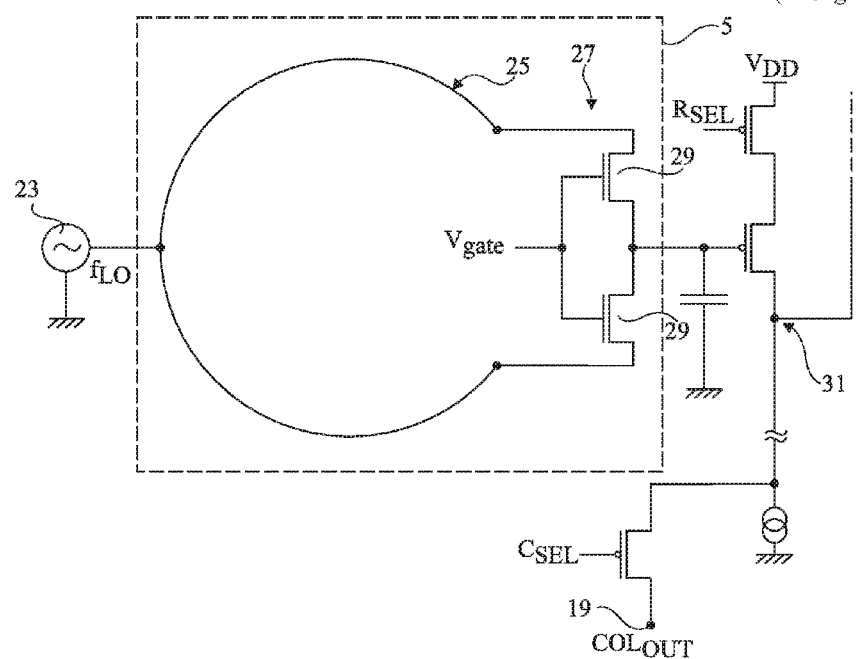
FIG. 2, described above, is a reproduction of FIG. 3 of US patent application No 2014/070103 schematically representing an example of a pixel of the sensor of FIG. 1.
Figure 3:
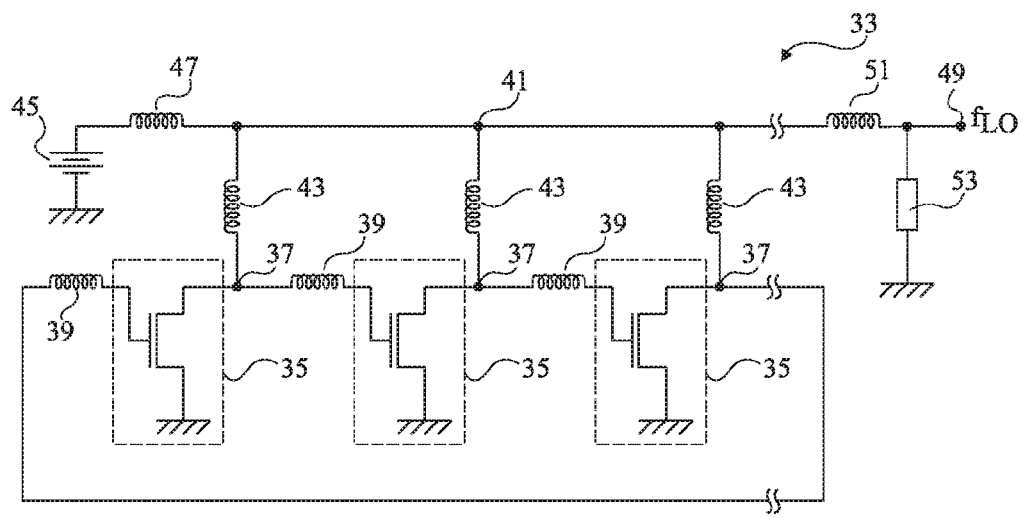
FIG. 3, described above, is a reproduction of FIG. 5 of US patent application No 2014/070103 schematically illustrating an example of terahertz frequency oscillation circuit.
Figure 4:
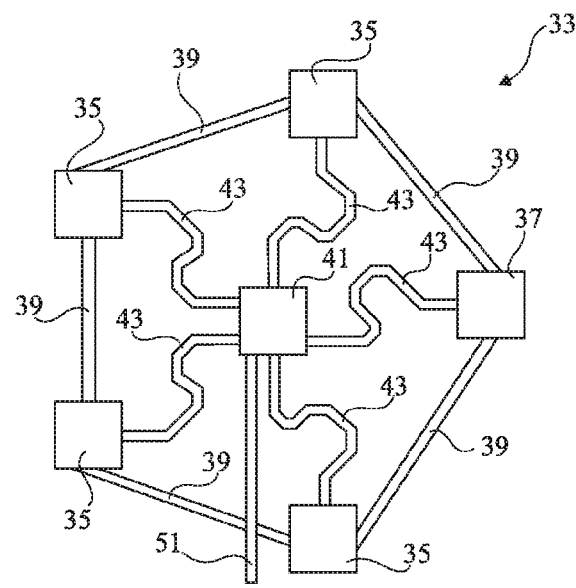
FIG. 4, described above, is a reproduction of FIG. 8 of US patent application No 2014/070103 schematically representing an example of implementation of the circuit of FIG. 3.
Figure 5:
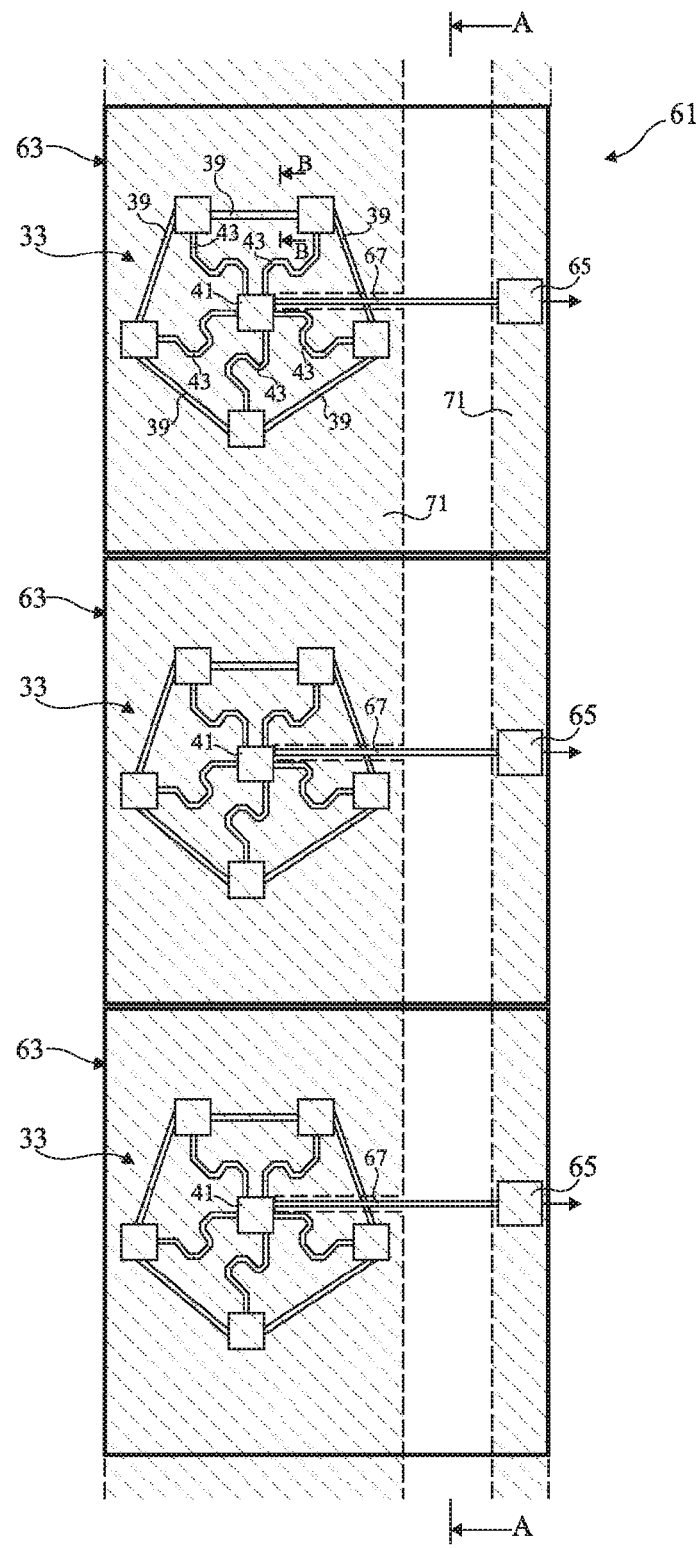
FIG. 5 is a schematic plan view representing a portion of the pixels of a terahertz imager according to an embodiment of the present disclosure.

FIG. 5 is a schematic top view of an embodiment of a terahertz imager, only a portion of the imager being shown in this figure. The imager comprises a matrix 61 of pixels 63, three pixels of a column of the matrix 61 being shown in FIG. 5. Each pixel comprises an oscillator, for example such as disclosed in connection with FIGS. 3 and 4, a read circuit 65 and a transmission line 67. An end of the transmission line 67 is coupled to the node 41 of oscillator 33 and the other end is coupled to the read circuit 65. The read circuit of each pixel is adapted to provide a signal representative of the impedance value of line 67. The read circuit of each pixel is coupled to a line and column selection circuit (not shown) controlled by a line decoder and a column decoder (not shown). In this embodiment, the oscillator 33 and in some embodiments the detection circuit 65 of each pixel 63 are shielded by a shielding layer 71, for example a metal layer, blocking the propagation of high frequency waves.

In operation, the oscillator 33 of each pixel is biased by a DC voltage source coupled to the transmission line 67, for example through the detection circuit 65 of the pixel. The oscillator 33 thus provides a terahertz signal having a frequency f and a wavelength $\lambda$ to the transmission line 67.

Figure 6:
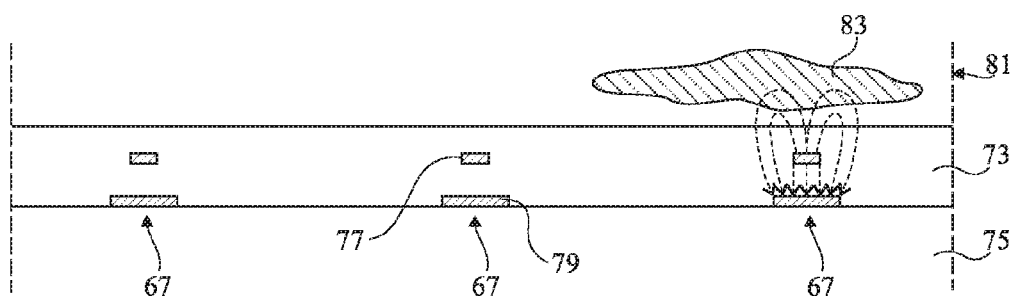
FIG. 6 is a cross-sectional view in a plane AA of FIG. 5 and represents a transmission line of the imager.
Figure 7:
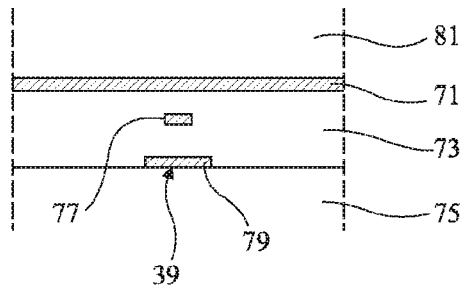
FIG. 7 is a cross-sectional view in a plane BB of FIG. 5 and represents a shielded transmission line of the imager.

FIGS. 6 and 7 are respectively a cross-sectional view in a plane AA of FIG. 5 and a cross-sectional view in a plane BB of FIG. 5.

FIG. 6 shows three transmission lines 67 of three pixels 63 of the imager of FIG. 5. The transmission lines 67 are formed in metallization levels buried in an insulating layer 73 laying on a semiconductor support 75. Each transmission line comprises a microstrip 77 above a conductive band 79 forming a ground plane. The microstrip 77 of each transmission line 67 is covered by an insulating layer having a thickness smaller than $\lambda$ and preferably smaller than $0.1\lambda$, where $\lambda$ is the wavelength of the signal of the oscillator coupled to the line.

An object 81 to be analyzed is arranged against the upper face or active face of the pixel matrix of the imager. The object may include a plurality of materials having different dielectric constants and present inhomogeneities of effective dielectric constant.

When a terahertz signal of frequency f and wavelength $\lambda$ is applied to a line 67, terahertz fields radiate from the microstrip 77 to the ground plane 79, as shown by dotted lines for the right-hand pixel of FIG. 6, and a part of the fields leaks outside of the imager elements. These terahertz fields penetrate a superficial layer of the object 81 to be analyzed. The term "analysis depth" designates the thickness of the superficial layer of the object in which these terahertz waves penetrate. The analysis depth is in the order of several wave lengths $\lambda$, for example in the range to $3\lambda$, i.e., 0.1 to 0.3 mm if the frequency f is equal to 3 THz, and from 1 to 3 mm if the frequency f is equal to 300 GHz.

The impedance of a transmission line 67 depends upon the effective dielectric constant of the imager elements and of the material of object 81 that is positioned over this line and thus will be different for the two pixels arranged on the right in FIG. 6, which are positioned under an inhomogeneity 83, and for the pixel arranged on the left of FIG. 6. An image of the dielectric constants of the material of the upper layer of the object 81 is thus obtained from the set of output signals of the pixels of the imager. The resolution of the imager thus corresponds to the dimensions of its pixels. For example, in the case of an oscillator 33 with five inverters providing a signal at 600 GHz, each pixel can have lateral dimensions of 20 to 50 µm.

A characteristic of the above disclosed pixels is that the transmission line 67 of each pixel serves as an emitter of terahertz waves for illuminating a portion of an object to be analyzed and is also used as a detector to capture a signal associated with the effective dielectric constant of this portion.

As an example, the semiconductor support 75 is a bulk silicon substrate or a SOI type ("Silicon On Insulator") substrate in which are formed the electronic components of the imager, in particular the transistors of the pixels. This support is covered with metallization levels of an interconnection structure of the electronic components formed in the semiconductive support. The microstrip 77 and the ground planes 79 of the transmission lines 67 are formed in these metallization levels.

In an example application, the object 81 analyzed by the imager of FIG. 5 is the skin of a person in which one wishes to localize cancerous cells. If for example, the cancerous cells comprise more water than the healthy cells, their dielectric constant is not the same as that of healthy cells and this inhomogeneity of the dielectric constant can be detected and located.

In another example, the object to be analyzed is a liquid, for example blood, in which one wishes to know the concentration and/or the movement of suspended solid elements having a dielectric constant different from that of the liquid.

FIG. 7 is a cross-sectional view in the plane BB of FIG. 5 and shows a shielded transmission line, for example a line 39. The transmission line 39 and the shielding layer 71 are formed in metallization levels. The presence of the shielding layer 71 means that the functioning of the line is not dependent on the material of the superficial layer of the object to be analyzed.

In a variant, lines 39 and 43 are not shielded. The impedance of lines 39, 43 of each pixel then depends on the object seen by this pixel and the frequency f of the oscillator varies as a consequence. It is possible to measure the frequencies f and or the varying output voltage or current of the pixels of the imager to reconstitute an image of the materials of the superficial layer of the object to be analyzed. In fact, it is possible to tailor the design of the transmission lines and the oscillators to be sensitive to specific dielectric constant ranges, or to be broadband.

Specific embodiments have been disclosed. Variants and modifications will appear to those skilled in the art. In particular, transmission lines different from those disclosed above can be used, for example coplanar transmission lines.

The oscillator contained in each pixel can be replaced by any other oscillator, for example the oscillator disclosed in the article "A 283-to-296 GHz VCO with 0.76 mW Peak Output Power in 65 nm CMOS", by Y. M. Tousi et al., published in Solid-state Circuits Conference Digest of Technical Papers (ISSCC), 2012 IEEE International, pages 258 to 260.

In practice, the pixels 63 of the imager are not read simultaneously. For example, the pixels are read sequentially one by one. It is then possible to turn off the pixels that are not being read, for example by not biasing the oscillator of these pixels.

In some embodiments, the imager matrix 61 analyzes the superficial layer at a plurality of analysis depths. For example, the lines of some groups of pixels 63 are coated with an insulating layer thicker than the lines of other groups of pixels. Additionally or alternatively, the oscillators of some groups of pixels operate at frequency different from those of other groups of pixels.

While terahertz imagers have been disclosed above, it will be noted that the description applies to any near-field high frequency imager, where high frequency means a frequency of 10 GHz or more.

Various embodiments and variants have been disclosed. It will be apparent to those skilled in the art that the various elements in the various embodiments can be combined in any combination without inventive step.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A high frequency imager, comprising:
    a pixel matrix, each pixel comprising:
        a high frequency oscillator;
        a transmission line positioned at a distance from an active surface of the imager smaller than the operating wavelength of the oscillator, a first end of the line being coupled to the oscillator; and
        a read circuit coupled to a second end of the line.

2. The imager of claim 1, wherein the read circuit of each pixel provides a signal representative of an impedance of the transmission line.

3. The imager of claim 1, wherein the oscillator of each pixel comprises second transmission lines.

4. The imager of claim 3, wherein a layer adapted to block the propagation of the high frequency waves covers at least the second lines.

5. The imager of claim 3, wherein the read circuit of a pixel provides a signal representative of a frequency of the oscillator of the pixel.

6. The imager of claim 1, wherein the transmission lines are of the microstrip type.

7. The imager of claim 1, adapted to operate at a frequency selected in a range of 0.3 to 3 THz.

8. An imaging circuit, comprising:
    a semiconductor support;
    an insulating layer formed on the semiconductor support, the insulating layer having an active surface;
    a pixel matrix formed in the semiconductor support and the insulating layer, the pixel matrix including a plurality of pixels each including,
        an oscillator circuit having an operating wavelength;
        a read circuit; and
        a first transmission line coupled between the oscillator circuit and the read circuit, the first transmission line being formed in the insulating layer at a distance from the active surface that is less than the operating wavelength of the oscillator circuit.

9. The imaging circuit of claim 8 wherein the first transmission line of each pixel comprises a coplanar transmission line.

10. The imaging circuit of claim 8, wherein the first transmission line of each pixel comprises a microstrip transmission line including a microstrip portion and a conductive band portion, the microstrip portion being formed in the insulating layer at the distance from the active surface and the conductive band portion being formed on a surface of the semiconductor support.

11. The imaging circuit of claim 10, wherein the oscillator circuit of each pixel includes a plurality of second transmission lines.

12. The imaging circuit of claim 11, wherein each of the plurality of second transmission lines comprises a microstrip transmission formed in the insulating layer.

13. The imaging circuit of claim 12, wherein each of the plurality second transmission lines further comprises a shielding layer formed on the active surface of the insulating layer.

14. The imaging circuit of claim 13, wherein the shielding layer is formed on the active surface over the oscillator circuits and over the read circuits but not covering the first transmission lines.

15. The imaging circuit of claim 14, wherein each of the second transmission lines forms an inductive component of the oscillator circuit.

16. The imaging circuit of claim 15, wherein each oscillator circuit comprises a ring oscillator circuit including N inverters, N being an odd integer, and wherein the second transmission lines interconnect the N inverters.

17. The imaging circuit of claim 8, wherein the semiconductor support comprises one of a bulk silicon substrate and a silicon-on-insulator substrate.

* * * * *